(12) United States Patent
Chou et al.

(10) Patent No.: US 12,282,255 B2
(45) Date of Patent: Apr. 22, 2025

(54) SILVER PATTERNING AND INTERCONNECT PROCESSES

(71) Applicant: Taiwan Semiconductor Manufacturing Co., Ltd., Hsinchu (TW)

(72) Inventors: You-Hua Chou, Hsinchu (TW); Kuosheng Chuang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/739,140

(22) Filed: Jun. 10, 2024

(65) Prior Publication Data

US 2024/0329533 A1  Oct. 3, 2024

Related U.S. Application Data

(62) Division of application No. 18/327,785, filed on Jun. 1, 2023, now Pat. No. 12,025,914, which is a division of application No. 16/803,885, filed on Feb. 27, 2020, now Pat. No. 11,681,225.

(51) Int. Cl.
*H01L 21/00* (2006.01)
*G03F 7/06* (2006.01)
*H01L 21/033* (2006.01)

(52) U.S. Cl.
CPC ............ *G03F 7/06* (2013.01); *H01L 21/0332* (2013.01); *H01L 21/0337* (2013.01)

(58) Field of Classification Search
CPC ............... H01L 21/033; H01L 21/0332; H01L 21/0334; H01L 21/0337; H01L 21/308; H01L 21/3081; H01L 21/3086
See application file for complete search history.

(56) References Cited

U.S. PATENT DOCUMENTS

| | | |
|---|---|---|
| 5,567,570 A | 10/1996 | Rostoker et al. |
| 2006/0094172 A1 | 5/2006 | Lee et al. |
| 2007/0243363 A1 | 10/2007 | Kim et al. |
| 2008/0135839 A1 | 6/2008 | Lee et al. |
| 2009/0291230 A1 | 11/2009 | Lin et al. |
| 2010/0021652 A1 | 1/2010 | Lin et al. |
| 2013/0092931 A1 | 4/2013 | Knutson et al. |
| 2018/0019393 A1 | 1/2018 | Liu et al. |

OTHER PUBLICATIONS

Eisa et al., "Gamma-irradiation assisted seeded growth of Ag nanoparticles within PVA matrix," Materials Chemistry and Physics 128:109-113, 2011.

*Primary Examiner* — Reema Patel
(74) *Attorney, Agent, or Firm* — Seed IP Law Group

(57) ABSTRACT

A method for forming a semiconductor structure is provided. The method includes depositing a hard mask layer over a substrate. The method further includes depositing a silver precursor layer over the hard mask layer. The method further includes exposing portions of the silver precursor layer to a radiation, the radiation causing a reduction of silver ions in the irradiated portions of the silver precursor layer. The method further includes removing non-irradiated portions of the silver precursor layer, resulting in a plurality of silver seed structures.

20 Claims, 9 Drawing Sheets

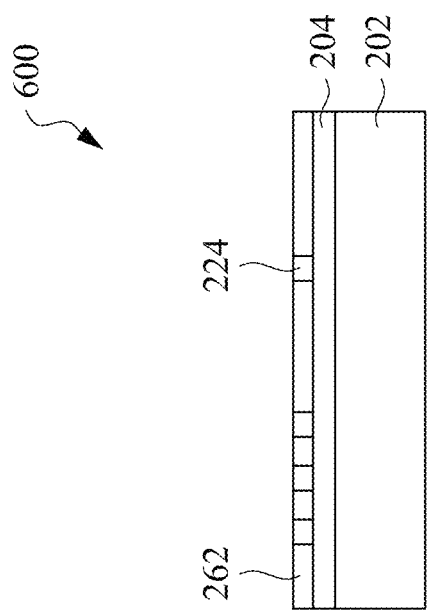
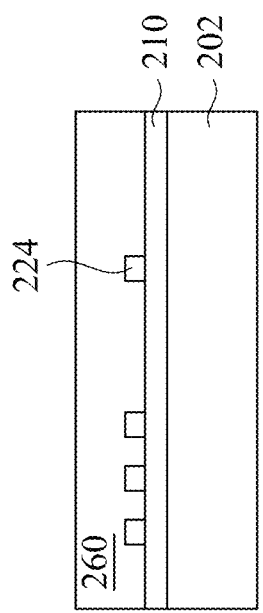
FIG. 6A
FIG. 6B

SILVER PATTERNING AND INTERCONNECT PROCESSES

BACKGROUND

Integrated circuits contain numerous devices such as transistors, diodes, capacitors and resistors that are fabricated on and/or in a semiconductor substrate. These devices are initially isolated from one another and are later interconnected together to form functional circuits in the back end of line (BEOL) processing stage. In manufacturing of integrated circuits, patterns used to form semiconductor devices and interconnect structures are defined using photolithography processes. In a photolithography process, a photomask having a pattern is irradiated with light to transfer the pattern onto a semiconductor substrate.

BRIEF DESCRIPTION OF THE DRA WINGS

The present disclosure is best understood from the following detailed description when read in conjunction with the accompanying drawings. It is emphasized that, according to common practice, the various features of the drawings are not necessarily drawn to scale. On the contrary, the dimensions and spatial relationship(s) of the various features may be arbitrarily enlarged or reduced for clarity. Like reference numerals denote like features throughout specification and drawings.

FIGS. 6A and 6B are cross-sectional views of a semiconductor structure at various stages of the fabrication process, in accordance with some embodiments

DETAILED DESCRIPTION

Figure 1:
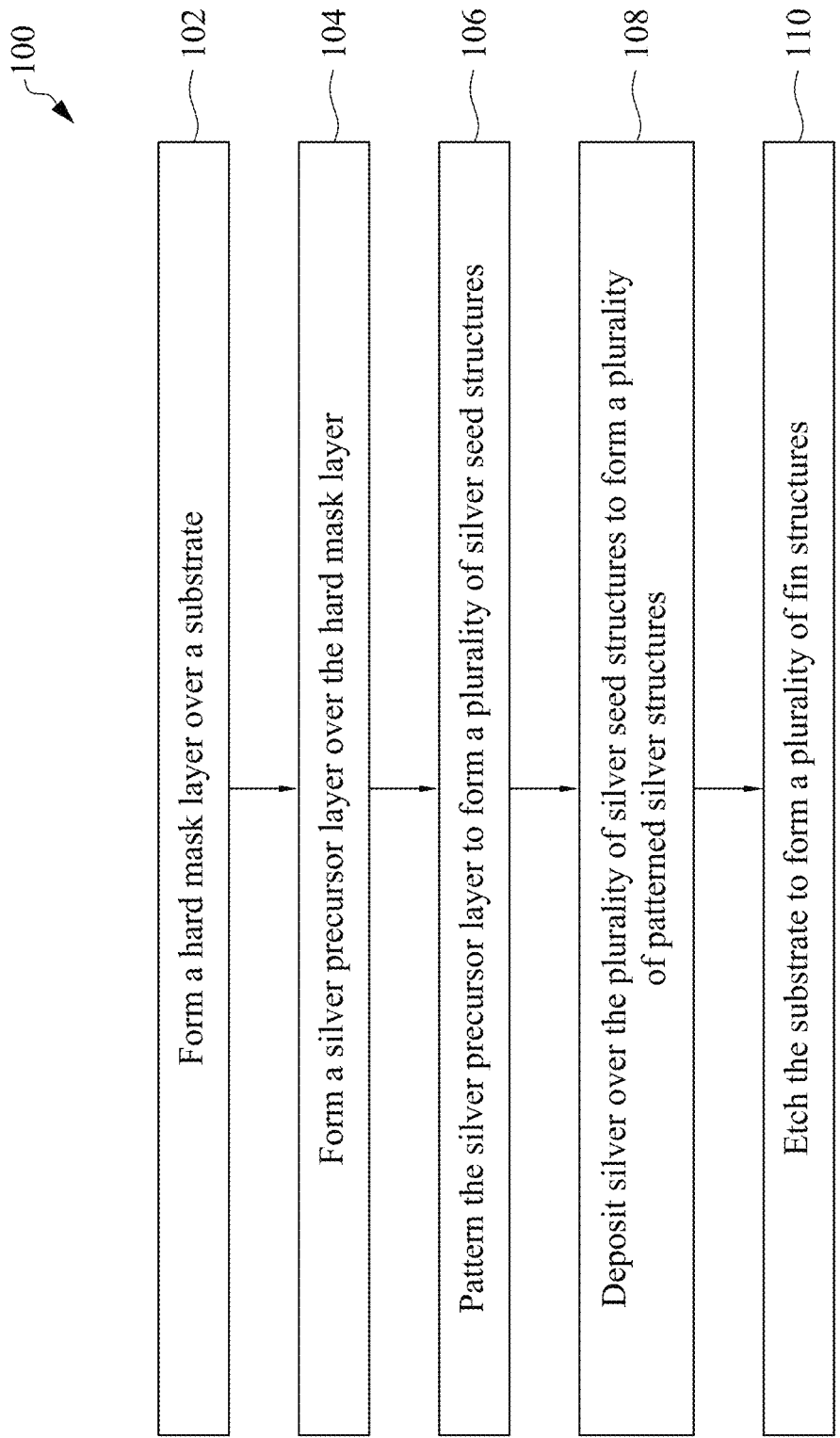
FIG. 1 is a flowchart of a method of fabricating a semiconductor structure, in accordance some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry continues to improve the integration density of various electronic components (e.g., transistors, diodes, resistors, capacitors, etc.) by continual reductions in minimum feature size, which allows more components to be integrated into a given area. To improve photolithography resolution so smaller features can be patterned, the exposure wavelength of photolithography has been shortened. In recent years, photolithography that uses extreme ultraviolet (EUV) light with a wavelength of 13.5 nm has been developed, which allows realizing a resolution of 20 nm or less. One disadvantage of using EUV radiation is that the EUV radiation is generated with a high power source that is unstable. The high power EUV light source tends to produce non-uniform illumination, resulting in size variation in the patterned features. The need for higher resolution photolithography processes with uniform feature sizes thus remains.

With the continuous scaling of devices, the semiconductor technology demands use of low resistivity metals such as copper in interconnects. However, the sputtered copper normally has a grain size greater than 20 nm, which makes the further reduction of the feature size difficult. Low resistivity metal that allows further reducing feature sizes thus is needed.

In embodiments of the present disclosure, gamma ray radiation is used to lithographically pattern a light sensitive silver precursor layer containing silver ions. The gamma ray radiation reduces silver ions in the irradiated portions of the silver precursor layer to silver metal, thereby providing silver seed structures. The further growth of silver on the silver seed structures provides patterned silver structures which can be directly used as metal electrodes or as an etch mask for semiconductor processing. The gamma rays exhibit a shorter wavelength than the EVU light, and thus are capable of generating silver seed structures with a better resolution than EUV lithography. Furthermore, gamma rays are generated by naturally occurring gamma ray sources which can provide high power intensity, and as a result, the use of gamma rays for lithography helps to improve uniformity of the patterned features, which in turn helps to reduce variations in device performance.

FIG. 1 is a flowchart of a method 100 of patterning a substrate (e.g., a semiconductor wafer), in accordance with various aspects of the present disclosure. The method 100 may be implemented, in part, by a system employing gamma ray lithography, and other lithography processes to improve pattern uniformity. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 2A-2E wherein a semiconductor device 200 is fabricated by using embodiments of the method 100.

Figure 2C:
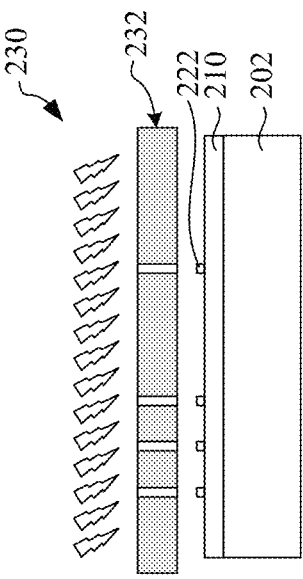
FIGS. 2A-2E are cross-sectional views of a semiconductor structure at various stages of the fabrication process, in accordance with some embodiments.

The method 100 (FIG. 1) includes operation 102 in which a hard mask layer 210 is formed over a substrate 202 (FIG. 2A), in accordance with some embodiments. Referring to FIG. 2A, the substrate 202 includes one or more layers of material of composition. In some embodiments, the substrate 202 is a semiconductor substrate (e.g., wafer). In some embodiments, the substrate 202 includes a single crystalline silicon. In alternative embodiments, the substrate 202 includes other elementary semiconductors such as germanium, or a compound semiconductor such as silicon carbide, gallium arsenide, indium arsenide, and indium phosphide. In some embodiments, the substrate 202 includes a silicon on insulator (SOI) substrate, which is strained/stressed for performance enhancement; includes epitaxial regions; includes isolation regions; includes doped regions; includes one or more semiconductor devices or portions thereof; includes conductive and/or non-conductive layers; and/or includes other suitable features and layers. In some embodiments, the substrate 202 is a polymer substrate or a dielectric substrate.

The hard mask layer 210 is formed over the substrate 202. The hard mask layer 210 helps to enhance the wetting property of a silver precursor layer 220 (FIG. 2B) subsequently formed thereon. The hard mask layer 210 also helps to protect the substrate 202 during the subsequent patterning of the silver precursor layer 220. In some embodiments, the hard mask layer 210 includes a dielectric oxide such as, for example, silicon oxide, or a high-k dielectric oxide having a dielectric constant greater than 4.0. Exemplary high-k dielectric oxides include, but are not limited to, aluminum oxide ($Al_2O_3$), hafnium oxide ($H_fO_2$), titanium oxide ($TiO_2$), and zirconium oxide ($ZrO_2$). In some embodiments, the hard mask layer 210 is deposited by chemical vapor deposition (CVD), plasma enhanced chemical vapor deposition (PECVD), atomic layer deposition (ALD), or other suitable deposition processes. In alternative embodiments, the hard mask layer 210 is formed by thermal oxidation a surface portion of the substrate 202.

Figure 2E:
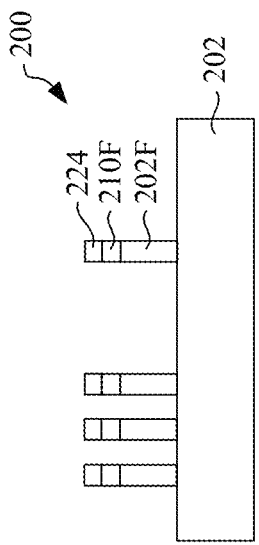
Figure 2A:
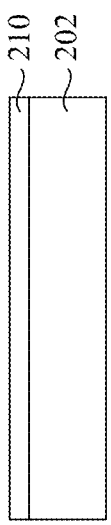
Figure 2B:
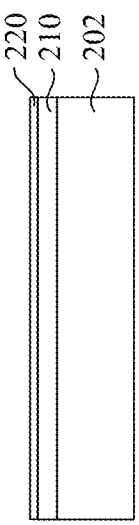

The method 100 (FIG. 1) proceeds to operation 104, in which a silver precursor layer 220 is formed over the hard mask layer 210 (FIG. 2B). Referring to FIG. 2B, in some embodiments, the silver precursor layer 220 includes a silver salt that is sensitive to the gamma ray radiation. Examples of suitable silver salts that can be employed in the present disclosure include, but are not limited to, silver halides such as silver fluoride, silver chloride and silver bromide, silver nitrate, silver nitrite, silver sulfide, silver phosphorate, silver perchlorate, silver tetrafluoroborate, silver acetylacetonate, silver acetate, silver lactate, silver oxalate, and silver citrate. In some embodiments, the silver precursor layer 220 includes silver fluoride.

In some embodiments, the silver precursor layer 220 is formed by dissolving one or more silver salts into a solvent to provide a silver precursor solution and then applying the silver precursor solution onto the hard mask layer 210 in a dark environment that is substantially absence of light. Examples of suitable solvents that can be employed to make the silver precursor solution include, but are not limited to, deionized (DI) water, alcohols such as methanol, ethanol, isopropanol, 1-methoxy propanol, butanol, ethylhexyl alcohol, and terpineol, or glycols such as ethyleneglycol and glycerin. The amount of the silver salt in the silver precursor solution varies depending on the type of the particular silver salt in the solvent. In some embodiments, the concentration of the silver salt in the silver precursor solution is from 5 wt. % to 80 wt. %. The silver precursor solution is applied using any suitable solution coating process such as spin-on coating, spray coating, dip coating, or screen printing. In some embodiments, after the deposition, the silver precursor layer 220 is subjected to a soft baking process to drive the residue solvent out of the silver precursor layer 220.

The thickness of the silver precursor layer 220 depends on the power of the gamma ray radiation applied in the photolithography patterning process subsequently performed. If the thickness of the silver precursor layer 220 is too great, the risk of the gamma ray radiation not being able to penetrate through the silver precursor layer 220 to reduce the silver ions at the bottom portion of the silver precursor layer 220 increases, in some instances. If the thickness of the silver precursor layer 220 is too small, the dimensions of the resulting silver seed structures are too small to form the final silver pattern with required dimensions, in some instances. In some embodiments, the thickness of the silver precursor layer 220 is from about 0.1 nm to about 3 nm.

The method 100 (FIG. 1) proceeds to operation 106, in which the silver precursor layer 220 is lithographically patterned to form a plurality of silver seed structures 222 (FIG. 2C), in accordance with some embodiments. Referring to FIG. 2C, the silver seed structures 222 protrude from the hard mask layer 210. The silver seed structures 222 include silver metal, and are usable as seeds to promote deposition of silver thereon.

The silver seed structures 222 are formed by first exposing the silver precursor layer 220 to a radiation 230 in a lithography system. In some embodiments, the radiation 230 is patterned with a photomask 232, such as a transmissive mask or a reflective mask. Alternatively, in some embodiments, the radiation 230 is directly modulated with a pre-defined pattern, such as a layout of an integrated circuit, without using a mask (i.e., maskless lithography). The radiation 230 illuminates portions of the silver precursor layer 220 according to a pattern, either with a mask or maskless. The silver ions in the radiated portions of the silver precursor layer 220 are reduced to silver metal, thereby forming a pattern of silver metal.

In some embodiments, the radiation 230 is a gamma ray radiation having a frequency from about 1019 Hz to 1022 Hz and a wavelength on the order of about 10-1 nm to about 10-3 nm. The gamma ray radiation exhibits a wavelength shorter than EUV radiation, and thus, is able to provide better resolution than EUV radiation. In some embodiments, the gamma ray radiation is produced by a radioactive cobalt source such as Cobalt-60. The intensity of the gamma ray radiation is controlled such that the gamma ray radiation is able to reduce silver ions through an entire thickness of the silver precursor layer 220. Too high intensity of the gamma ray radiation causes the scattering of the gamma rays, which reduces the feature resolution.

After exposure, the non-irradiated portions of the silver precursor layer 220 are dissolved by a developer, leaving the silver seed structures 222, which are irradiated portions of the silver precursor layer 220 on the hard mask layer 210. In some embodiments, the non-irradiated portions of the silver precursor layer 220 are removed using DI water.

Figure 2D:
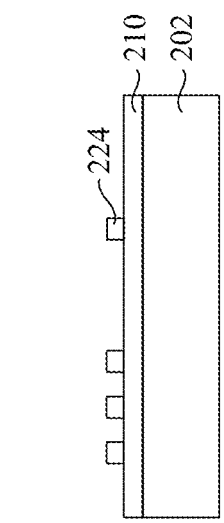

The method 100 (FIG. 1) proceeds to operation 108, in which silver is deposited over the silver seed structures 222 to provide a plurality of patterned silver structures 224 protruding from the hard mask layer 210 (FIG. 2D), in accordance with some embodiments. Referring to FIG. 2D, silver is selectively deposited over the silver seed structures 222 by any suitable selective deposition processes. In some embodiments, silver is deposited over the silver seed structures 222 by ALD using suitable organic silver precursors. In other embodiments, silver is deposited over the silver seed structures 222 by electroless plating. The silver deposition increases the thickness and dimension of the silver seed structures 222. After the deposition, in some embodiments, the patterned silver structures 224 are annealed to increase the grain size of the silver and to relax accumulated stress in the patterned silver structures 224. In some embodiments, the patterned silver structures 224 are annealed at a temperature that is below a melting temperature of silver to prevent melting of silver. In some embodiments, the patterned silver structures 224 are annealed at a temperature no greater than 660° C.

The method 100 (FIG. 1) proceeds to operation 110, in which the substrate 202 is etched using the patterned silver structures 224 as an etch mask, thereby transferring the pattern from the patterned silver structures 224 to the substrate 202 (FIG. 2E). Referring to FIG. 2E, the pattern is first transferred from the patterned silver structures 224 to the hard mask layer 210, then to the substrate 202, thereby providing a plurality of hard mask structures 210F and a plurality of fin structures 202F protruding from a base portion of the substrate 202. In some embodiments, at least one anisotropic etch such as a dry etch, a wet etch, or a combination thereof is performed to remove portions of the hard mask layer 210 and the substrate 202 that are exposed by the patterned silver structures 224. In some embodiments, a dry etch such as RIE is implemented using an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Although not shown in FIG. 1, the method 100 may proceed to form a final pattern or a semiconductor device on the substrate 202. In some embodiments, the substrate 202 is a semiconductor substrate and etching the substrate 202 forms a plurality of semiconductor fins at operation 110. The method 100 proceeds to form fin field effect transistors (FinFET) after etching the substrate 202. For example, the method 100 proceeds to remove the hard mask structures 210F and patterned silver structures 224 from top surfaces of the semiconductor fins and then to form one or more gate structures and doped source/drain regions over the semiconductor fins.

Figure 3:
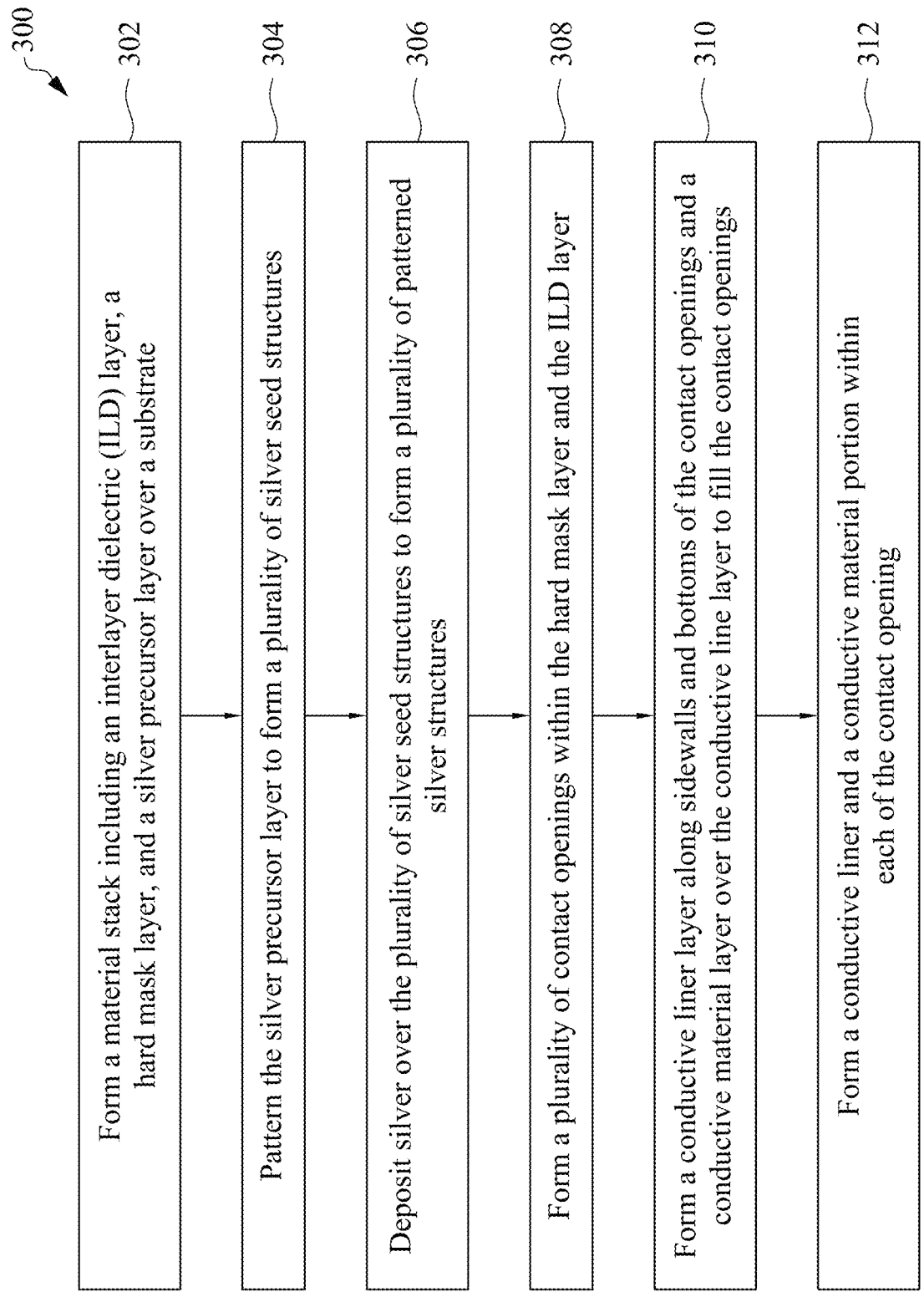
FIG. 3 is a flowchart of a method for fabricating a semiconductor structure, in accordance with some embodiments.

FIG. 3 is a flowchart of a method 300 of forming a semiconductor structure 400, in accordance with some embodiments of the present disclosure. FIGS. 4A through 4H are cross-sectional views of the semiconductor structure 400 at various stages of the fabrication process, in accordance with some embodiments. Unless specified otherwise, the materials and formation methods of the components in these embodiments are essentially the same as the like components, which are denoted by like reference numerals in the embodiments shown in FIGS. 2A through 2E. The formation details of the embodiment shown in FIGS. 4A through 4H may, thus, be found in the discussion of the embodiments shown in FIGS. 2A through 2E. The method 300 is discussed in detail below, with reference to the semiconductor structure 400. The flowchart illustrates only a relevant part of the entire manufacturing process for a semiconductor structure 400. It is understood that additional operations may be provided before, during, and after the operations shown by FIG. 3, and some of the operations described below can be replaced or eliminated for additional embodiments of the method. The order of the operations/processes may be interchangeable.

Referring to FIG. 3, the method 300 includes operation 302, in which a material stack including an interlayer dielectric (ILD) layer 204, a hard mask layer 210, and a silver precursor layer 220 is formed over a substrate 202 (FIG. 4A), in accordance with some embodiments.

Figure 4B:
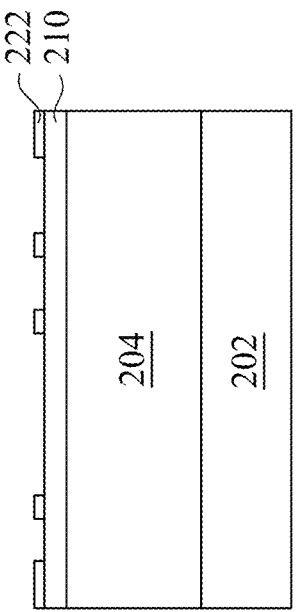
FIGS. 4A-4H are cross-sectional views of a semiconductor structure at various stages of the fabrication process, in accordance with some embodiments.
Figure 4D:
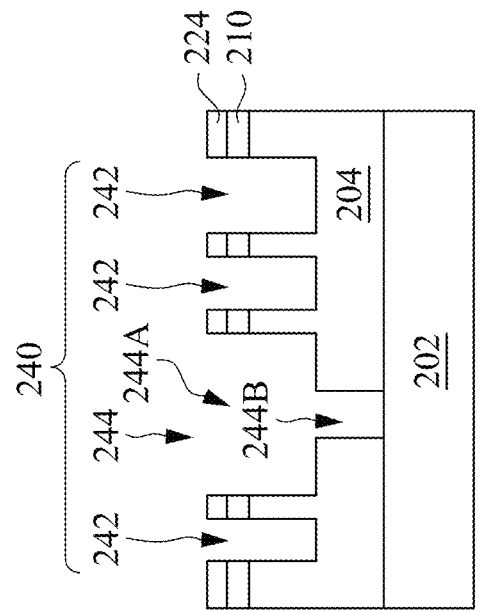
Figure 4A:
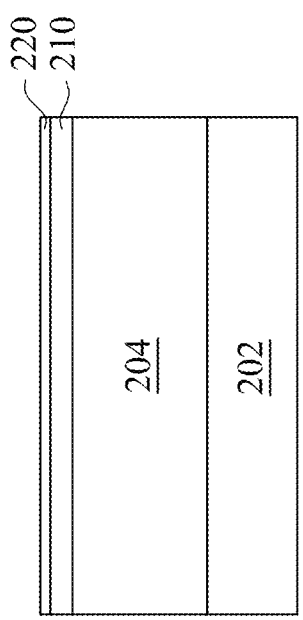
Figure 4C:
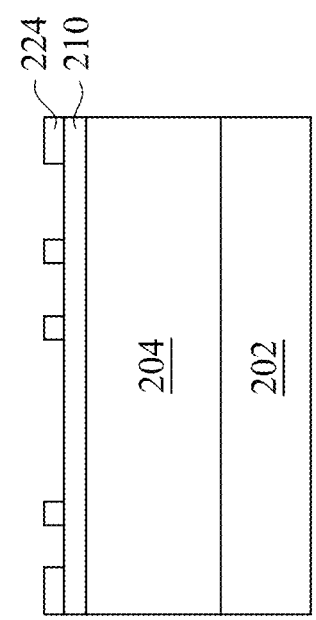

Referring to FIG. 4A, in some embodiments, the substrate 202 includes a semiconductor substrate (not separately shown) containing semiconductor devices such as field effect transistors therein and at least one dielectric layer (not separately shown) over the semiconductor substrate. The at least one dielectric layer embeds a plurality of conductive structures that provide electrical connections to various components such as gate and source/drain structures of semiconductor devices in the semiconductor substrate.

The ILD layer 204 is formed over the substrate 202. In some embodiments, the ILD layer 204 includes silicon oxide. In some embodiments, the ILD layer 204 includes a low-k dielectric material having a dielectric constant (k) less than 4. In some embodiments, the ILD layer 204 includes a low-k dielectric material having a k value less than 3.5. In some embodiments, the ILD layer 204 includes a low-k dielectric material having a k value less than 2.5. Suitable low-k dielectric materials include, but are not limited to, tetraethylorthosilicate (TEOS) oxide, undoped silicate glass, or doped silicate glass such as borophosphosilicate glass (BPSG), fluorosilicate glass (FSG), phosphosilicate glass (PSG), boron doped silicon glass (BSG), and porous dielectric materials. In some embodiments, the ILD layer 204 is deposited by CVD, PECVD, spin coating, or other suitable deposition processes.

The hard mask layer 210 is deposited over the ILD layer 204. The composition and formation of the hard mask layer 210 are described above in operation 102 of FIG. 1 and FIG. 2A, and are not described in detail herein.

The silver precursor layer 220 is deposited over the hard mask layer 210. The composition and formation of the silver precursor layer 220 are described above in operation 104 of FIG. 1 and FIG. 2B, and are not described in detail herein.

Referring to FIG. 3, the method 300 proceeds to operation 304, in which the silver precursor layer 220 is lithographically patterned to form a plurality of silver seed structures 222 (FIG. 4B), in accordance with some embodiments. The formation of silver seed structures 222 is implemented using processes described above in operation 106 of FIG. 1, and is not described in detail herein.

Referring to FIG. 3, the method 300 proceeds to operation 306, in which silver is deposited over the silver seed structures 222 to provide a plurality of patterned silver structures 224 protruding from the hard mask layer 210 (FIG. 4C), in accordance with some embodiments. The formation of patterned silver structures 224 is implemented using processes described above in operation 108 of FIG. 1, and is not described in detail herein.

Referring to FIG. 3, the method 300 proceeds to operation 308, in which a plurality of contact openings 240 is formed within the hard mask layer 210 and the ILD layer 204 (FIG. 4D), in accordance with some embodiments.

Referring to FIG. 4D, in some embodiments, the plurality of contact openings 240 include first contact openings 242 which are trench openings and a second contact opening 244 which is a combination of a trench opening 244A and a via opening 244B. The first contact openings 242 extend through the hard mask layer 210 into an upper portion of the ILD layer 204, exposing a sub-surface of the ILD layer 204. The second contact opening 244 extends through the hard mask layer 210 and the ILD layer 204, exposing a top surface of a conductive structure (not shown) in the substrate 202. Although a single second contact opening 244 is illustrated and described in FIG. 4D, any number of second contact openings are contemplated in the present disclosure.

Figure 4E:
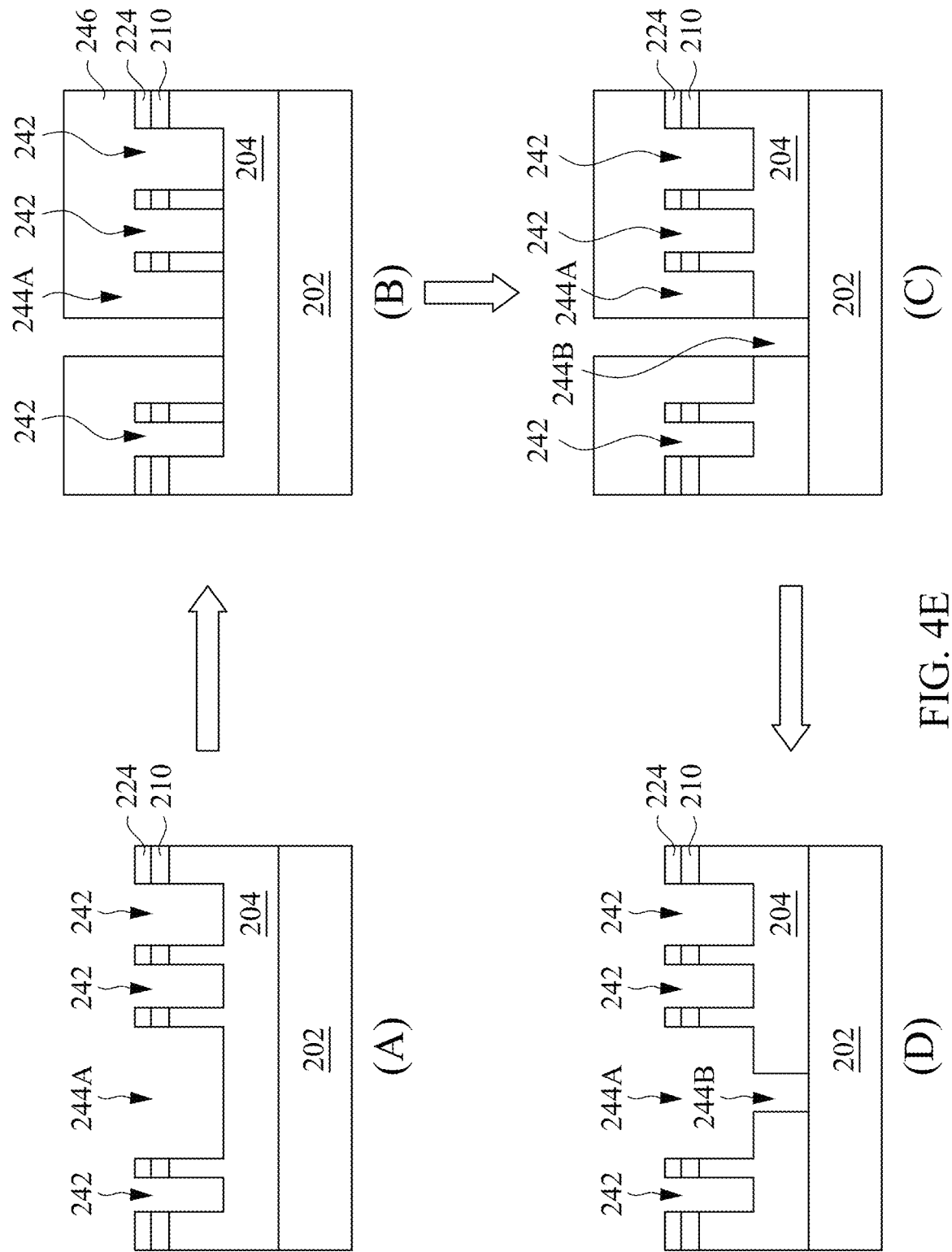
Figure 4F:
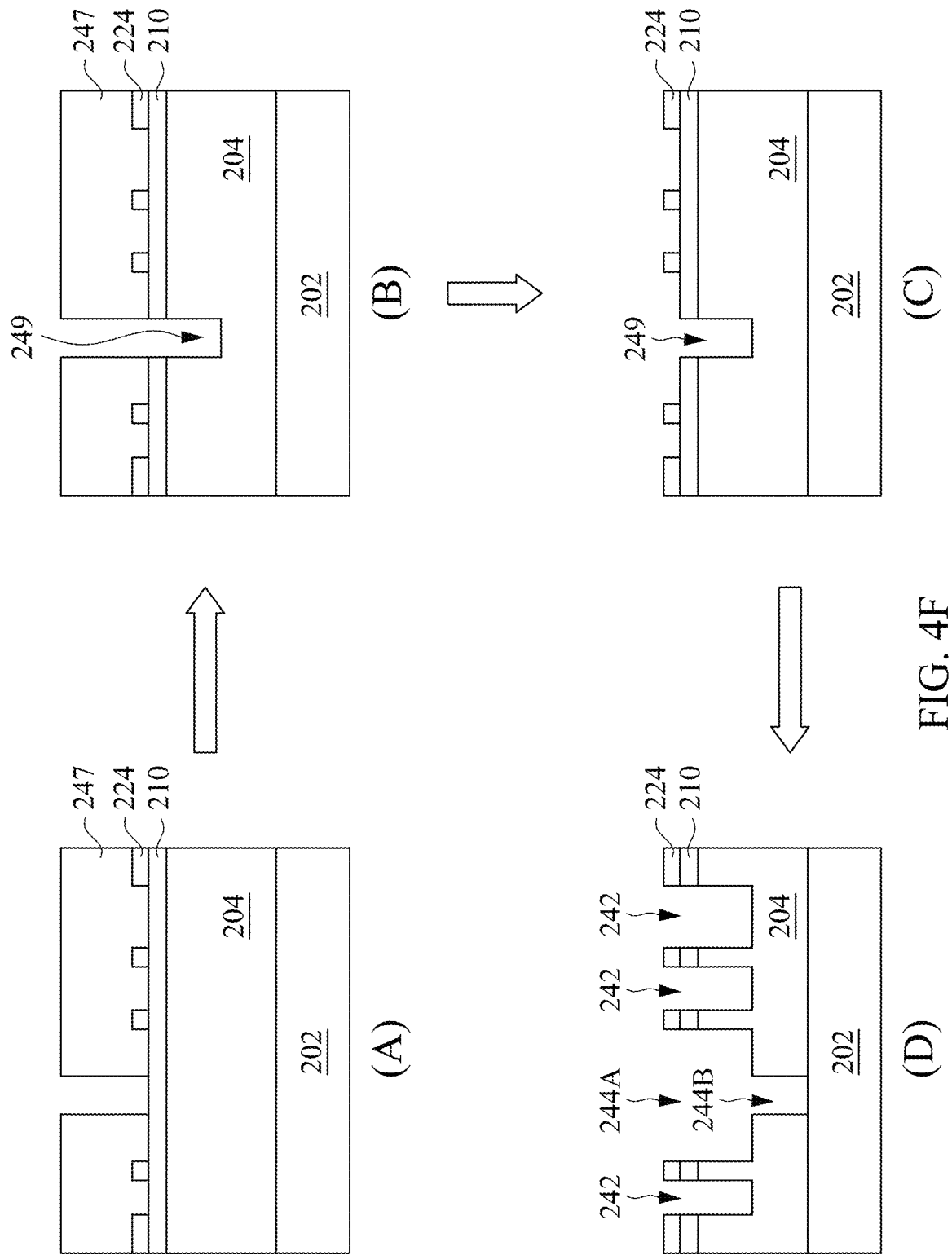

In some embodiments, the contact openings 240 are formed using a dual damascene process. In some embodiments, the contact openings 240 are formed using a trench-first scheme, as illustrated in FIG. 4E. In the trench-first scheme, an etching process is first performed to define the first contact openings 242 and the trench opening 244A that extend through the hard mask layer 210 and into the upper portion of the ILD layer 204 using the patterned silver structures 224 as an etching mask (Step A). In some embodiments, the first etching process includes a single etch that removes portions of the hard mask layer 210 and the ILD layer 204 that are not covered by the patterned silver structures 224 at the same time. In some embodiments, the first etching process includes multiple etches such that a first etch is performed to remove portions of the hard mask layer 210 that are not covered by the patterned silver structures 224, exposing portions of the underlying ILD layer 204, and a second etch is subsequently performed to remove the exposed portions of the ILD layer 204. In some embodiments, the first etching process includes a dry etch, such as RIE or plasma etch. After forming the first contact openings 242 and the trench opening 244A, a photolithography patterning and etching process is performed to define the via opening 244B beneath the trench opening 244A. A photoresist layer (not shown) is first applied over the patterned silver structures 224 to fill the first contact openings 242 and the trench opening 244A. The photoresist layer is then patterned by exposing the photoresist layer to a pattern of radiation, performing post-exposure bake processes, and developing the photoresist layer to form a pattern photoresist layer 246 (Step B). Once the patterned photoresist layer 246 is formed, an etching process is performed to etch the ILD layer 204 using the patterned photoresist layer 246 as an etch mask, thereby forming the via opening 244B beneath the trench opening 244A (Step C). In some embodiments, the etching process that forms the via opening 244B includes a dry etch such as RIE or plasma etch. After formation of the via opening 244B, the patterned photoresist layer 246 is removed, for example, by wet stripping or plasma ashing (Step D). Alternatively, in some embodiments, the contact openings 240 are formed using a via-first scheme, as illustrated in FIG. 4F. In the via-first scheme, a photoresist layer is first applied over the patterned silver structures 224 and the hard mask layer 210 and lithographically patterned to form a patterned photoresist layer 247, exposing an area where the via opening 244B is located (Step A). The hard mask layer 210 and the ILD layer 204 are subsequently etched using the patterned photoresist layer 247 as an etch mask to form an initial via opening 249 (Step B). The initial via opening 249 extends into a portion of the ILD layer 204. After formation of the initial via opening 249, the patterned photoresist layer is removed, for example, by wet stripping or plasma ashing (Step C). Next, an etching process is performed to etch the hard mask layer 210 and the ILD layer 204 to define the first contact openings 242 and the trench opening 244A in the upper portion of the ILD layer 204 using the patterned silver structures 224 as an etching mask (Step D). The etching process also extends the initial via opening 249 down through the remaining portion of the ILD layer 204, forming the via opening 244B beneath the trench opening 244A (Step D). In some embodiments, the etching process that forms the first contact openings 242 and the trench opening 244A includes a dry etch, such as RIE or plasma etch.

Referring to FIG. 3, the method 300 proceeds to operation 310, in which a contact liner layer 252 is formed along sidewalls and bottoms of the contact openings 240 and a contact material layer 254 is formed over the contact liner layer 252 to fill the contact openings 240 (FIG. 4G), in accordance with some embodiments.

Figure 4H:
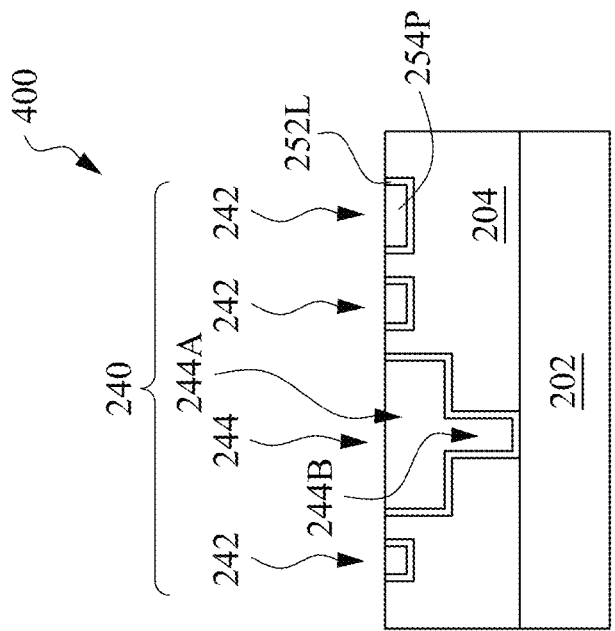
Figure 4G:
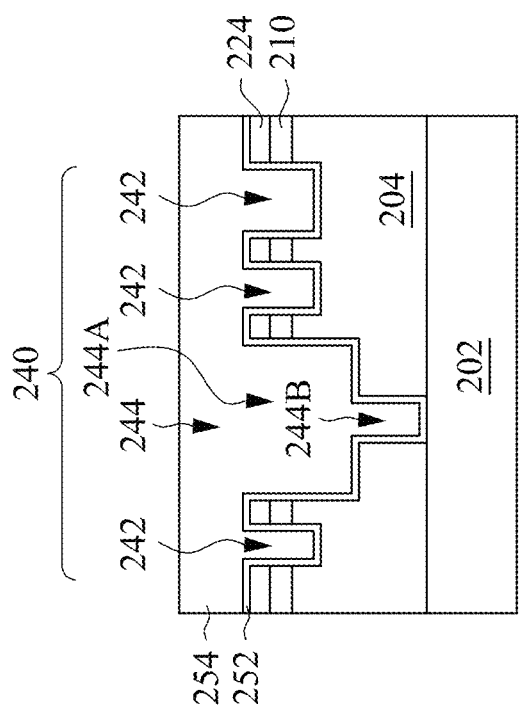

Referring to FIG. 4G, the contact liner layer 252 is deposited along sidewalls and bottoms of the contact openings 240 and over top surfaces of the patterned silver structures 224. In some embodiments, the contact liner layer 252 includes silver and is formed utilizing a conformal deposition process such as CVD, PECVD, PVD, or ALD.

Subsequently, the contact material layer 254 is deposited over the contact liner layer 252 to fill the contact openings 240. In some embodiments, the contact material layer 254 includes silver and is deposited by a suitable deposition process such as, for example, CVD, PECVD, PVD, or plating, such as electroless plating or electric plating. The deposition process is continued until the contact material layer 254 fills the contact opening 240 and extends above the top surfaces of the patterned silver structures 224.

Referring to FIG. 1, the method 300 proceeds to operation 312, in which interconnect structures each including a contact liner 252L and a contact material portion 254P are formed in the contact openings 240 (FIG. 4H), in accordance with some embodiments.

Referring to FIG. 4H, the interconnect structures (252L, 254P) are formed by removing portions of the contact material layer 254 and the contact liner layer 252 that are located above the top surface of the ILD layer 204 using a planarization process. In some embodiments, a chemical mechanical planarization (CMP) process is performed to remove the contact material layer 254 and the contact liner layer 252 from the top surface of the ILD layer 204. The CMP process also removes the patterned silver structures 224 and the hard mask layer 210 from the top surface of the ILD layer 204. After the planarization, a portion of the contact material layer 254 remaining in each of the contact openings 240 constitutes a contact material portion 254P, and a portion of the contact liner layer 252 remaining in each of the contact openings 240 constitutes a contact liner 252L. After the planarization process, top surfaces of the interconnect structures (252L, 254P) are coplanar with the top surface of the ILD layer 204.

Because silver has a higher conductivity than copper, the resulting interconnect structures (252L, 254P) possess lower wiring resistance than copper. In addition, silver is able to be deposited with grain sizes smaller than the grain sizes of copper, so that using the silver replacing copper allows further reducing feature sizes of interconnect structures (252L, 254P).

Figure 5:
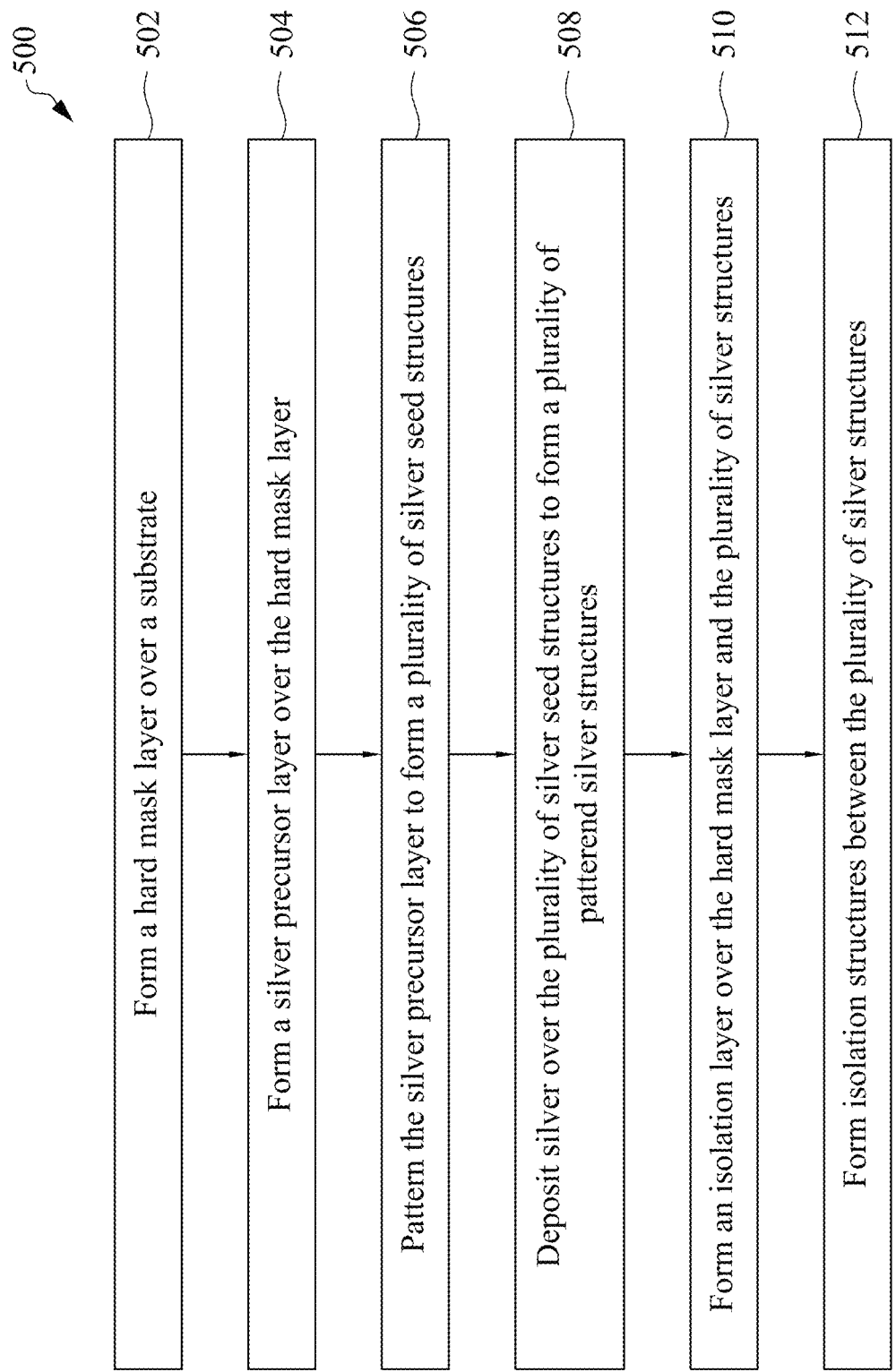
FIG. 5 is a flowchart of a method fabricating a semiconductor structure, in accordance with some embodiments.

FIG. 5 is a flowchart of a method 500 for fabricating a semiconductor structure 600, in accordance with some embodiments. FIGS. 6A through 6B are cross-sectional views of the semiconductor structure 600 at various stages of the fabrication process, in accordance with some embodiments. Unless specified otherwise, the materials and formation methods of the components in these embodiments are essentially the same as the like components, which are denoted by like reference numerals in the embodiments shown in FIGS. 2A through 2E. The formation details of the embodiment shown in FIGS. 6A through 6B may, thus, be found in the discussion of the embodiments shown in FIGS. 2A through 2E. The method 500 is discussed in detail below, with reference to the semiconductor structure 600. The flowchart illustrates only a relevant part of the entire manufacturing process for a semiconductor structure 600. It is understood that additional operations may be provided before, during, and after the operations shown by FIG. 5, and some of the operations described below can be replaced or eliminated for additional embodiments of the method. The order of the operations/processes may be interchangeable.

The initial steps of the method 500 may be essentially the same as shown in FIGS. 2A through 2D. Referring to FIG. 5, the method 500 includes operation 502, in which a hard mask layer 210 is deposited over a substrate 202, as shown in FIG. 2A. The method proceeds to operation 504, in which a silver precursor layer 220 is formed over the hard mask layer 210, as shown in FIG. 2B. The method 500 proceeds to operation 506, in which the silver precursor layer 220 is lithographically patterned to form a plurality of silver seed structures 222, as shown in FIG. 2C. The method 500 proceeds to operation 508, in which silver is deposited over the silver seed structures to form a plurality of silver structures, as shown in FIG. 2D.

Next, the method 500 proceeds to operation 510, in which an isolation layer 260 is deposited over the hard mask layer 210 to cover the patterned silver structures 224 (FIG. 6A), in accordance with some embodiments.

Referring to FIG. 6A, the isolation layer 260 is deposited to have a top surface above the top surfaces of the patterned silver structures 224. In some embodiments, the isolation layer 260 includes silicon dioxide, silicon oxynitride, silicon oxycarbonitride, fluorine doped silicon dioxide, carbon doped silicon dioxide, or other suitable dielectric materials. In some embodiments, the isolation layer 260 is formed by a flowable chemical vapor deposition (FCVD) process or a spin on dielectric (SOD) technique. During the FCVD or SOD process, one or more flowable dielectric materials are deposited within the spaces between the patterned silver structures 224 to form a flowable dielectric material film. Exemplary flowable dielectric materials include, but are not limited to, silicate, siloxane, methyl silsesquioxane (MSQ), hydrogen silsesquioxane (HSQ), perhydrosilazane (TCPS), perhydropolysilazane (PSZ), tetraethyl orthosilicate (TEOS), and a silyl-amine, such as trisilylamine (TSA). The flowable dielectric material is usually deposited in excess to completely cover the patterned silver structures 224.

After the flowable dielectric material film is formed, the flowable dielectric material film is cured so as to harden the flowable dielectric material film. Curing increases the viscosity of the flowable dielectric material film. In some embodiments, the flowable dielectric material film is cured in an oxygen-containing atmosphere such as an ozone-containing atmosphere. In some embodiments, the flowable dielectric material film is cured at a temperature ranging from about 100° C. to 600° C.

Subsequently, an annealing is performed to densify the flowable dielectric material film, thereby forming the isolation layer 260. In some embodiments, the annealing is performed in an oxygen-containing atmosphere. In some embodiments, the annealing is carried out at a temperature ranging from about 1000° C. to about 1200° C. In some embodiments, the annealing is a stream anneal process.

The method 500 proceeds to operation 512, in which isolation structures 262 are formed between the patterned silver structures 224 (FIG. 6B), in accordance with some embodiments.

Referring to FIG. 6B, the isolation structures 262 are formed between the patterned silver structures 224 and having top surfaces coplanar with top surfaces of the patterned silver structures 224. In some embodiments, a planarization process such as CMP is performed removing the isolation layer 260 from top surfaces of the patterned silver structures 224. Remaining portions of the isolation layer 260 between the patterned silver structures 224 constitute the isolation structures.

The isolation structures 262 electrically isolate the patterned silver structures 224 from each other. The patterned silver structures 224 can be used directly as metal electrodes for electronic devices.

One aspect of this description relates to a method of forming a semiconductor structure. The method includes depositing a hard mask layer over a substrate. The method further includes depositing a silver precursor layer over the hard mask layer. The method further includes exposing portions of the silver precursor layer to a radiation. The radiation causes a reduction of silver ions in the irradiated portions of the silver precursor layer. The method further includes removing non-irradiated portions of the silver precursor layer, resulting in a plurality of silver seed structures. In some embodiments, depositing the silver precursor layer comprises applying a silver precursor solution onto a surface of the hard mask layer in a dark environment that is substantially absence of light. In some embodiments, applying the silver precursor solution onto the surface of the hard mask layer comprises applying the silver precursor solution using spin-on coating, spray coating, dip coating, or screen printing. In some embodiments, the method further includes forming the silver precursor solution, wherein forming the silver precursor solution comprises dissolving one or more silver salts into a solvent. In some embodiments, the one or more silver salts include silver fluoride, silver chloride, and silver bromide. In some embodiments, the solvent includes water or an alcohol. In some embodiments, exposing the portions of the silver precursor layer to the radiation includes passing the radiation through a photomask with a predefined pattern. In some embodiments, exposing the portions of the silver precursor layer to the radiation includes modulating the radiation with a predefined pattern. In some embodiments, exposing the portions of the silver precursor layer to the radiation includes exposing the portions of the silver precursor layer to a gamma ray radiation. In some embodiments, the method further includes depositing silver on the plurality of silver seed structures to provide a plurality of patterned silver structures. In some embodiments, the method further includes etching the hard mask layer and the substrate using the plurality of patterned silver structures as an etch mask.

Another aspect of this description relates to a method of forming a semiconductor structure. The method includes depositing a hard mask layer over a substrate. The method further includes depositing a silver precursor layer over the hard mask layer. The method further includes exposing portions of the silver precursor layer to a radiation. The radiation causes a reduction of silver ions in the irradiated portions of the silver precursor layer. The method further includes removing non-irradiated portions of the silver precursor layer by a developer, resulting in a plurality of silver seed structures. The method further includes depositing silver over the plurality of silver seed structures to provide a plurality of patterned silver structures. The method further includes depositing a dielectric layer over the hard mask layer and the plurality of the patterned silver structures. In some embodiments, depositing silver over the plurality of silver seed structures includes depositing silver using atomic layer deposition or electroless plating. In some embodiments, the silver precursor layer has a thickness ranging from about 0.1 nm to about 3 nm. In some embodiments, depositing the dielectric layer comprises depositing silicon dioxide, silicon oxynitride, silicon oxycarbonitride, fluorine doped silicon dioxide, or carbon doped silicon dioxide. In some embodiments, the method further comprises forming isolation structures between the plurality of patterned silver structures. Forming the isolation structures includes removing portions of the dielectric layer from surfaces of the plurality of patterned silver structures.

Still another aspect of this description relates to a method of forming a semiconductor structure. The method includes depositing an interlayer dielectric (ILD) layer over a substrate. The method further includes forming a hard mask layer over the ILD layer. The method further includes depositing a silver precursor layer over the hard mask layer. The method further includes exposing portions of the silver precursor layer to a radiation. The radiation causes a reduction of silver ions in the irradiated portions of the silver precursor layer. The method further includes removing non-irradiated portions of the silver precursor layer, resulting in a plurality of silver seed structures. The method further includes depositing silver over the plurality of silver seed structures to provide a plurality of patterned silver structures. The method further includes forming at least one contact opening within the hard mask layer and the ILD layer using the plurality of patterned silver structures as an etch mask. The method further includes depositing a contact liner layer along sidewall and bottom surfaces of the at least one contact opening and over the plurality of patterned silver structures. The method further includes depositing a contact material layer over the contact liner layer to fill the at least one contact opening. The contact liner layer and the contact material layer include silver. In some embodiments, the method further includes removing portions of the contact liner layer and the contact material layer from the plurality of patterned silver structures. In some embodiments, the method further includes removing the plurality of patterned silver structures and the hard mask layer from the ILD layer. In some embodiments, the radiation is a gamma ray radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
   depositing a hard mask layer over a substrate;
   depositing a silver precursor layer over the hard mask layer;
   exposing portions of the silver precursor layer to a radiation, the radiation causing reduction of silver ions in the irradiated portions of the silver precursor layer;
   removing non-irradiated portions of the silver precursor layer, resulting in a plurality of silver seed structures;
   forming a plurality of patterned silver structures by depositing silver on top and sidewall surfaces of the plurality of silver seed structures; and
   etching the hard mask layer and the substrate using the plurality of patterned silver structures as an etch mask.

2. The method of claim 1, wherein depositing the silver precursor layer comprises applying a silver precursor solution onto a surface of the hard mask layer in a dark environment that is absent of light.

3. The method of claim 2, wherein applying the silver precursor solution onto the surface of the hard mask layer comprises applying the silver precursor solution using spin-on coating, spray coating, dip coating, or screen printing.

4. The method of claim 2, further comprising forming the silver precursor solution, wherein forming the silver precursor solution comprises dissolving one or more silver salts into a solvent.

5. The method of claim 4, wherein the one or more silver salts comprise silver fluoride, silver chloride, silver bromide or combinations thereof.

6. The method of claim 4, wherein the solvent comprises water or an alcohol.

7. The method of claim 1, wherein exposing the portions of the silver precursor layer to the radiation comprises passing the radiation through a photomask with a predefined pattern.

8. The method of claim 1, wherein exposing the portions of the silver precursor layer to the radiation comprises modulating the radiation with a predefined pattern.

9. The method of claim 1, wherein exposing the portions of the silver precursor layer to the radiation comprises exposing the silver precursor layer to a gamma ray radiation.

10. A method for forming a semiconductor device, comprising:
    depositing a hard mask layer over a substrate;
    depositing a silver precursor layer over the hard mask layer;
    patterning the silver precursor layer to form a plurality of silver seed structures having a top surface and two opposing sidewall surfaces;
    depositing silver on the top surface and the sidewall surfaces of the plurality of silver seed structures, thereby forming a plurality of patterned silver structures;
    etching the hard mask layer and the substrate to remove portions of the hard mask layer and the substrate not covered by the plurality of patterned silver structures, thereby forming a plurality of hard mask structures and a plurality of semiconductor fins protruding from a base portion of the substrate; and
    removing the plurality of patterned silver structures and the plurality of hard mask structures from the plurality of semiconductor fins.

11. The method of claim 10, further comprising forming one or gate structures and doped source/drain regions over the plurality of semiconductor fins.

12. The method of claim 10, the hard mask layer and the substrate are etched by a fluorine-containing gas.

13. The method of claim 10, wherein the silver precursor layer comprises a silver salt, and the plurality of silver seed structures comprises silver metal.

14. The method of claim 10, wherein patterning the silver precursor layer comprises:
    irradiating portions of the silver precursor layer with gamma ray radiation, wherein the gamma ray radiation reduces silver ions in the irradiated portions of the silver precursor layer to form silver metal; and
    after irradiation, developing the silver precursor layer with a developer to remove non-irradiated portions of the silver precursor layer.

15. The method of claim 14, wherein the developer is water.

16. The method of claim 10, further comprising annealing the plurality of patterned silver structures after forming the plurality of the patterned silver structures.

17. The method of claim 16, wherein the plurality of patterned silver structures is annealed at a temperature below a melting temperature of silver.

18. A method for forming a semiconductor device, comprising:
- forming a hard mask layer over a semiconductor substrate;
- depositing a silver precursor layer over the hard mask layer, wherein the silver precursor layer comprises a silver salt;
- irradiating portions of the silver precursor layer to reduce silver ions in the silver salt, thereby forming a plurality of silver seed structures comprising silver metal;
- removing non-irradiated portions of the silver precursor layer;
- depositing silver over top and sidewall surfaces of the plurality of silver seed structures to form a plurality of patterned silver structures, the plurality of patterned silver structures having a dimension greater than a dimension of the plurality of silver seed structures;
- etching the hard mask layer to form a plurality of hard mask structures using the plurality of patterned silver structures as an etch mask; and
- etching the semiconductor substrate to form a plurality of semiconductor fins using the plurality of the patterned silver structures as an etch mask.

19. The method of claim 18, wherein irradiating the portions of the silver precursor layer comprises irradiating with a gamma ray radiation.

20. The method of claim 19, wherein the gamma ray radiation is irradiating through a photomask.

* * * * *